(12) United States Patent
Wen et al.

(10) Patent No.: US 9,824,913 B2
(45) Date of Patent: Nov. 21, 2017

(54) ISOLATION STRUCTURE AND MANUFACTURING METHOD THEREOF FOR HIGH-VOLTAGE DEVICE IN A HIGH-VOLTAGE BCD PROCESS

(71) Applicants: HANGZHOU SILAN INTEGRATED CIRCUIT CO., LTD, Hangzhou (Xiasha) (CN); HANGZHOU SILAN MICROELECTRONICS CO., LTD., Hangzhou, Zhejiang Province (CN)

(72) Inventors: Yongxiang Wen, Hangzhou (CN); Shaohua Zhang, Hangzhou (CN); Yulei Jiang, Hangzhou (CN); Yanghui Sun, Hangzhou (CN); Guoqiang Yu, Hangzhou (CN)

(73) Assignees: Hangzhou Silan Integrated Circuit Co., Ltd., Hangzhou (Xiasha) (CN); Hangzhou Silan Microelectronics Co., Ltd., Hangzhou Zhejiang Province (CN)

(*) Notice: Subject to any disclaimer, the term of this patent is extended or adjusted under 35 U.S.C. 154(b) by 0 days.

(21) Appl. No.: 14/403,405

(22) PCT Filed: Mar. 29, 2013

(86) PCT No.: PCT/CN2013/073437
§ 371 (c)(1),
(2) Date: Nov. 24, 2014

(87) PCT Pub. No.: WO2013/174177
PCT Pub. Date: Nov. 28, 2013

(65) Prior Publication Data
US 2015/0179497 A1 Jun. 25, 2015

(30) Foreign Application Priority Data
May 25, 2012 (CN) .......................... 2012 1 0171793

(51) Int. Cl.
*H01L 23/58* (2006.01)
*H01L 21/761* (2006.01)
(Continued)

(52) U.S. Cl.
CPC ...... *H01L 21/761* (2013.01); *H01L 21/76216* (2013.01); *H01L 21/76283* (2013.01); *H01L 29/0646* (2013.01); *H01L 21/8249* (2013.01)

(58) Field of Classification Search
CPC ............. H01L 21/761; H01L 21/76216; H01L 21/76283; H01L 21/8249; H01L 29/0646
See application file for complete search history.

(56) References Cited

U.S. PATENT DOCUMENTS 4,885,621 A * 12/1989 Yoder ................... G01L 9/0042
257/419
4,902,633 A 2/1990 Cambou
(Continued)

FOREIGN PATENT DOCUMENTS

CN 1726596 A 1/2006
CN 200993963 Y 12/2007
(Continued)

*Primary Examiner* — Trung Q Dang
*Assistant Examiner* — Wasiul Haider
(74) *Attorney, Agent, or Firm* — Birch, Stewart, Kolasch & Birch, LLP

(57) ABSTRACT

The invention provides an isolation structure and a manufacturing method thereof for a high-voltage device in a high-voltage BCD process, the isolation structure comprising: a semiconductor substrate having a first type of doping; an epitaxial layer having a second type of doping over the semiconductor substrate, wherein the first type of doping is opposite to the second type of doping; an isolation region having the first type of doping, wherein the isolation region extends through the epitaxial layer into the semiconductor substrate, and wherein the isolation region has a doping concentration on the same order as a doping concentration of
(Continued)

the epitaxial layer; a field oxide layer over the isolation region. This invention effectively isolates the epitaxial island where the BCD high-voltage device is located, thereby increasing the breakdown voltage of the high-voltage device in the BCD process. Further, with a minimum thickness of the field oxide layer, the parasitical threshold voltage between the aluminum wiring and the silicon surface of the high-voltage device can be higher than 1200V, thereby improving the planarization of oxide layer steps on the silicon surface in the whole high-voltage BCD process, and enhancing the reliability of the product.

10 Claims, 4 Drawing Sheets

(51) Int. Cl.
*H01L 21/762* (2006.01)
*H01L 29/06* (2006.01)
*H01L 21/8249* (2006.01)

(56) References Cited

U.S. PATENT DOCUMENTS

| | | | | |
|---|---|---|---|---|
| 4,936,928 | A * | 6/1990 | Shaw | H01L 21/761 148/33 |
| 5,801,078 | A * | 9/1998 | Jimenez | H01L 29/7802 257/E21.418 |
| 2003/0102564 | A1 | 6/2003 | Darwish | |
| 2006/0270096 | A1 * | 11/2006 | Brady | H01L 27/14603 438/73 |
| 2010/0032769 | A1 | 2/2010 | Hao et al. | |
| 2010/0164066 | A1 * | 7/2010 | Di Franco | H01L 23/5223 257/532 |
| 2011/0303977 | A1 * | 12/2011 | Huang | H01L 21/8249 257/339 |
| 2012/0098083 | A1 * | 4/2012 | Meyer | H01L 21/823878 257/500 |
| 2013/0072004 | A1 * | 3/2013 | Tsuchiko | H01L 21/8222 438/492 |

FOREIGN PATENT DOCUMENTS

| | | |
|---|---|---|
| CN | 101304029 A | 11/2008 |
| CN | 101350304 A | 1/2009 |
| CN | 102664161 A | 9/2012 |
| CN | 202616219 U | 12/2012 |

\* cited by examiner

ISOLATION STRUCTURE AND MANUFACTURING METHOD THEREOF FOR HIGH-VOLTAGE DEVICE IN A HIGH-VOLTAGE BCD PROCESS

TECHNICAL FIELD

This invention relates to an isolation structure and a manufacturing method thereof for a high-voltage device in a high-voltage BCD process, and more particularly, to an isolation structure and a manufacturing method thereof for a high-voltage device in a high-voltage BCD process on an order of 1200V.

BACKGROUND

BCD process is a monolithic integrated processing technique, which can fabricate Bipolar, CMOS and DMOS devices on the same chip, and is simply referred to as BCD process. Since the BCD process incorporates the respective advantages of the three devices above, it becomes a leading processing technique in the integrated circuits. The BCD processing technique has been developed for many years and has many proven processing solutions. The BCD process may select different devices for different circuits to optimize the respective electric circuit devices, achieving the requirements of low power-consumption, high integration, high speed, and high driving capacity of the whole circuit. The BCD process is an excellent choice for IC manufacture process such as power management, display driving, auto electronics, etc., and has a wide market prospect.

As the enhancement of the national energy saving and consumption reducing, the high-power semiconductor discrete device industry develops continuously, quickly and steadily, and the industry scale is increasing. The electrical and electronic power modules and components with a high-voltage integrated circuit as a core high-voltage power switch device are applied more and more widely, and are progressing in three different research directions of high voltage, high power, and high density. For example, the high-voltage integrated circuit in the inverter motor driving circuit for the three-phase AC 380V, 440V, and 480V power supply employs a 1200V high-voltage BCD process product. For the 1200V high-voltage BCD process, besides the development of the essential 1200V high-voltage LDMOS devices, it is also necessary to develop an isolation structure to effectively isolate the epitaxial island where the high-voltage device is located. Meanwhile, a parasitical effect caused to the silicon surface by the high voltage on the aluminum wiring of the high-voltage device must be considered, e.g., the parasitical threshold voltage between aluminum wiring and the silicon surface of the 1200V device must be higher than 1200V.

SUMMARY

This invention intends to solve the technical problem of providing an isolation structure and a manufacturing method thereof for a high-voltage device in a high-voltage BCD process, so as to effectively isolates the epitaxial island where the BCD high-voltage device is located, and to increase the breakdown voltage of the high-voltage device in the BCD process, such as LDMOS transistors, etc. Further, with a minimum thickness of the field oxide layer, the parasitical threshold voltage between the aluminum wiring and the silicon surface of the high-voltage device can be higher than 1200V, thereby improving the planarization of oxide layer steps on the silicon surface in the whole high-voltage BCD process, and enhancing the reliability of the product.

To solve the technical problem above, the invention provides an isolation structure for a high-voltage device in a high-voltage BCD process, comprising:

a semiconductor substrate having a first type of doping;

an epitaxial layer having a second type of doping over the semiconductor substrate, wherein the first type of doping is opposite to the second type of doping;

an isolation region having the first type of doping, wherein the isolation region extends through the epitaxial layer into the semiconductor substrate, and wherein the isolation region has a doping concentration on the same order as a doping concentration of the epitaxial layer; and a field oxide layer over the isolation region.

Optionally, when the high-voltage device breaks down, charges in the isolation region and an epitaxial island where the high-voltage device is located are completely depleted, wherein the epitaxial island refers to the epitaxial layer between adjacent isolation regions.

Optionally, the field oxide layer has a thickness of 6000~18000 Å.

Optionally, the epitaxial layer is a stacked structure.

Optionally, the epitaxial layer is a stacked structure with 2 layers, including stacked first epitaxial layer and second epitaxial layer.

Optionally, the first epitaxial layer has a thickness of 3.0~15.0 μm and a resistivity of 1.0~10 Ω·cm; the second epitaxial layer has a thickness of 3.0~15.0 μm and a resistivity of 1.0~4.0 Ω·cm.

Optionally, the first type of doping is P-type, and the second type of doping is N-type.

Optionally, the isolation structure further comprises:

an isolation surface region of the first type of doping located on a surface of the epitaxial layer beneath the field oxide layer.

The invention also provides a method for manufacturing an isolation structure for a high-voltage device in a high-voltage BCD process, comprising:

providing a semiconductor substrate having a first type of doping;

forming an epitaxial layer having a second type of doping over the semiconductor layer, and forming an isolation region having the first type of doping in the epitaxial layer, wherein the isolation layer extends through the epitaxial layer into the semiconductor substrate, wherein the isolation region has a doping concentration on the same order as the epitaxial layer, and the first type of doping is opposite to the second type of doping; and forming a field oxide layer over the isolation region.

Optionally, the field oxide layer has a thickness of 6000~18000 Å.

Optionally, the epitaxial layer is a stacked structure.

Optionally, the epitaxial layer is a stacked structure with 2 layers, wherein the epitaxial layer and the isolation region are formed by a process including:

performing ion implantation to the semiconductor substrate to form therein a first buried layer of the first type of doping and a second buried layer of the second type of doping;

growing a first epitaxial layer over the semiconductor substrate, wherein the first epitaxial layer covers the first buried layer and the second buried layer;

locating with a lithography mask and implanting ions of the first type of doping into the first epitaxial layer, to form a first isolation region;

annealing the first isolation region;

growing a second epitaxial layer over the first epitaxial layer;

locating with a lithography mask and implanting ions of the first type of doping into the second epitaxial layer, to form a second isolation region; and annealing the second isolation region, such that the second isolation region, the first isolation region and the first buried layer joint in sequence to form the isolation region.

Optionally, the ions implanted into the first buried layer are boron ions with an implanting energy of 60~100 KeV and an implantation dosage of $1E12~1E14/cm^2$.

Optionally, the ions implanted into the first isolation region are boron ions with an implanting energy of 60~100 KeV and an implantation dosage of $1E12~1E14/cm^2$.

Optionally, the ions implanted into the second isolation region are boron ions with an implanting energy of 60~100 KeV and an implantation dosage of $1E12~1E14/cm^2$.

Optionally, the first epitaxial layer has a thickness of 3.0~15.0 μm and a resistivity of 1.0~10 Ω·cm, the second epitaxial layer has a thickness of 3.0~15.0 μm and a resistivity of 1.0~4.0 Ω·cm.

Optionally, the first type of doping is P-type, and the second type of doping is N-type.

Optionally, prior to forming the field oxide layer, the method further comprises:

locating with a mask and implanting ions of the first type of doping into a surface of the epitaxial layer to form an isolation surface region, wherein the field oxide layer is located over the isolation surface region.

Optionally, the ions implanted into the isolation surface region are boron ions with an implanting energy of 25~50 KeV and an implantation dosage of $5E13~5E14/cm^2$.

As compared with the prior art, the invention has the following advantages:

In the isolation structure and manufacturing method thereof for a high-voltage device in a high-voltage BCD process according to an embodiment of the invention, the isolation region has a doping concentration on the same order as a doping concentration of the epitaxial layer, such that the concentration of an epitaxial island between isolation regions nearly reaches a balanced state with the isolation region. When the device breaks down at a high-voltage, charges in the isolation region and the epitaxial island where the high-voltage device is located are almost completely depleted, such that the breakdown point of the high-voltage device on the epitaxial island occurs on the vertical epitaxial junction surface, thereby increasing the breakdown voltage of the devices such as LDMOS transistor.

Further, since the doping concentration of the isolation region in an embodiment of this invention is lower than that of a conventional isolation junction, the carrier concentration is lower accordingly. Moreover, when a device breaks down at a high-voltage, the charges in the isolation region will almost be completely depleted. It is known from the CV theory for a MOS capacitor that, with a lower carrier concentration, the oxide layer of the MOS capacitor may be thinner at the same threshold voltage. For example, in a 1200V order high-voltage BCD process, the thickness of the field oxide layer under the aluminum wiring of the high-voltage device may be smaller, and the isolation structure can still withstand a parasitical breakdown voltage of 1200V, thereby improving the planarization of the oxide layer steps on the silicon surface in the whole high-voltage BCD process, and enhancing the reliability of the product.

Additionally, the isolation structure in an embodiment of this invention is made separately on the vertical direction, and is formed by jointing a buried layer in the semiconductor substrate and isolation regions in multiple epitaxial layers, which can reduce the lateral diffusion size of the isolation region, thereby saving the footprint area. Moreover, for an isolation region of P-type doping, an isolation surface region of P-type doping may be formed under the field oxide layer to prevent the electric leakage phenomena of the isolation structure caused by decrease of the surface impurity concentration of the isolation structure due to the boron adsorption effect in forming the field oxide layer.

DETAILED DESCRIPTION

The invention is further described in conjunction with the following specific embodiments and the drawings, although the scope of the invention is not so limited.

Figure 1:
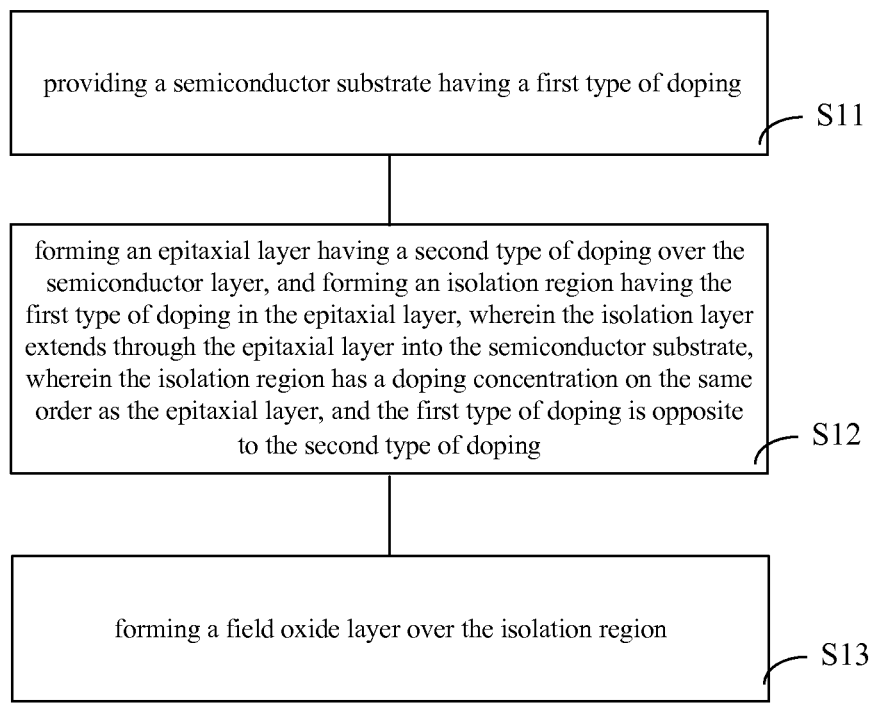
FIG. 1 is a schematic flowchart of a method for manufacturing an isolation structure for a high-voltage device in a high-voltage BCD process according to an embodiment of the invention.

FIG. 1 shows a schematic flowchart of a method for manufacturing an isolation structure for a high-voltage device in a high-voltage BCD process according to an embodiment of the invention. The method comprises:

Step S11, providing a semiconductor substrate having a first type of doping;

Step S12, forming an epitaxial layer having a second type of doping over the semiconductor layer, and forming an isolation region having the first type of doping in the epitaxial layer, wherein the isolation layer extends through the epitaxial layer into the semiconductor substrate, wherein the isolation region has a doping concentration on the same order as the epitaxial layer, and the first type of doping is opposite to the second type of doping; and Step S13, forming a field oxide layer over the isolation region.

The first type of doping is one of P-type doping and N-type doping, and the second type of doping is the other of P-type doping and N-type doping. In this embodiment, the first type of doping is P-type doping, and the second type of doping is N-type doping. However, those skilled in the art should understand, the above two types of doping are interchangeable.

The method for manufacturing an isolation structure for a high-voltage device in a high-voltage BCD process according to an embodiment of the invention is described in details below in conjunction with FIG. 1 and FIGS. 2-8.

Figure 2:
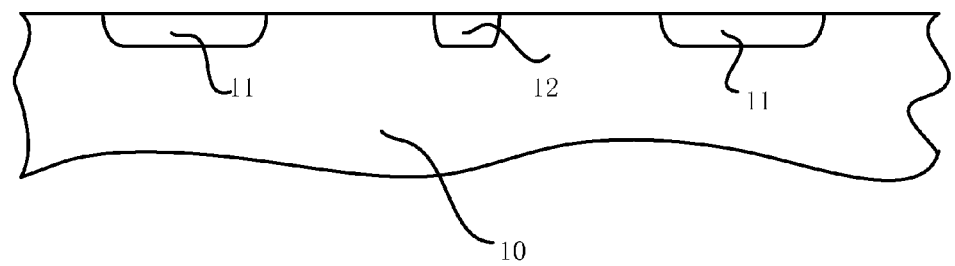
FIGS. 2-8 are cross-sectional structural schematic diagrams corresponding to various steps of a method for manufacturing an isolation structure for a high-voltage device in a high-voltage BCD process according to an embodiment of the invention.

Initially, refer to FIG. 2, a semiconductor substrate 10 of P-type doping is provided, in which a first buried layer 12 of P-type doping and a second buried layer 11 of N-type doping are formed.

The semiconductor substrate 10 may be, e.g., a silicon substrate having a crystal orientation of <100> and a resistivity of 10~300 Ω·cm. The initially oxidized oxide layer has a thickness selective between 0.2~0.6 μm.

The first buried layer 12 and the second buried layer 11 may be formed in a process comprising: locating a region for the second buried layer 11 of N-type doping with a lithography mask, then performing ion implantation, wherein the implanted ions may be for example antimony ions, the implanting energy may be 60 KeV, and the implantation dosage is selective between $1E15{\sim}2E15/cm^2$, then annealing at an annealing temperature selective between 1200~1250° C. for a time duration selective between 0.5~2 H; locating a region for the first buried layer 12 of P-type doping with a lithography mask, then performing ion implantation, wherein the implanted ions may be for example boron ions, the implanting energy may be 60~100 KeV, and the implantation dosage is selective between $1E12{\sim}1E14/cm^2$, then annealing at an annealing temperature selective between 1000~1100° C. for a time duration selective between 0.5~2 H. The first buried layer 12 of P-type doping is a first layer of the isolation region.

Figure 3:
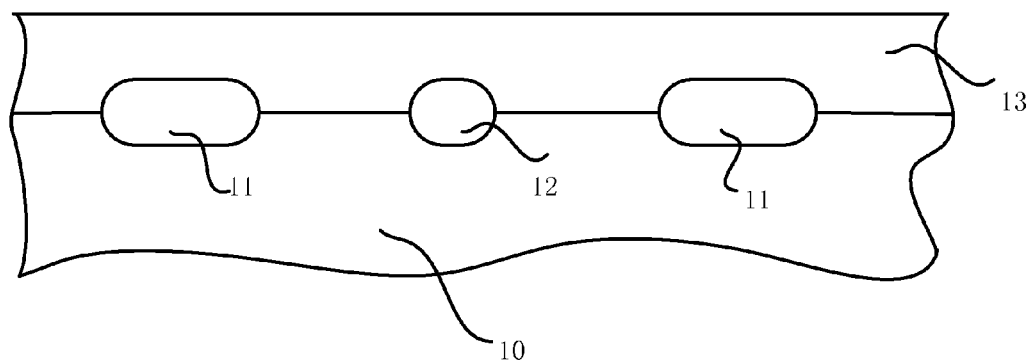

Refer to FIG. 3, a first epitaxial layer 13 of N-type doping is grown over the semiconductor substrate 10, the first epitaxial layer 13 covering the first buried layer 12 and the second buried layer 11. In particular, it may include: cleaning with HF acid of 1:10~1:20 prior to forming the first epitaxial layer 13, then growing the first epitaxial layer 13 having a thickness of 3.0~15.0 μm and a resistivity of 1.0~10 Ω·cm.

Figure 4:
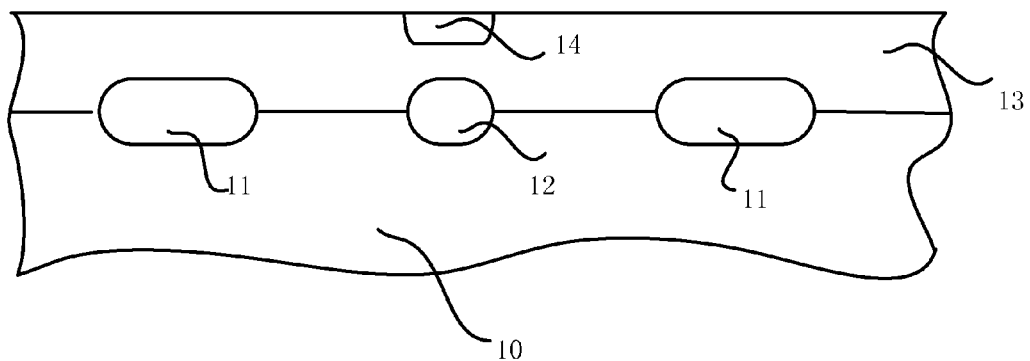

Refer to FIG. 4, ions are implanted into the first epitaxial layer 13 to form a first isolation region 14 of P-type doping, which serves as a second layer of the isolation region. In particular, it may include: growing a thin oxide layer with a thickness selective between 300 Å to 600 Å; then locating the first isolation region 14 with a lithography mask and performing ion implantation, wherein the implanted ions may be for example boron ions, the implanting energy may be 60~100 KeV, and the implantation dosage is $1E12{\sim}1E14/cm^2$; then annealing at an annealing temperature selective between 1000~1100° C. for a time duration selective between 0.5~2 H.

Figure 5:
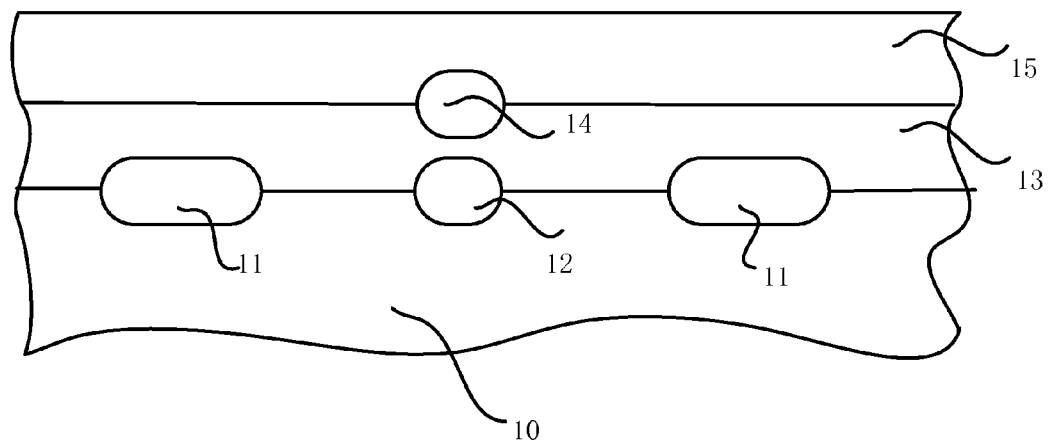

Refer to FIG. 5, a second epitaxial layer 15 of N-type doping is grown over the first epitaxial layer 13. In particular, it may include: cleaning with HF acid of 1:10~1:20 prior to growing the second epitaxial layer 15, then growing the second epitaxial layer 15 with a method such as epitaxial growth, the second epitaxial layer 15 having a thickness of 3.0~15.0 μm and a resistivity of 1.0~4.0 Ω·cm.

Figure 6:
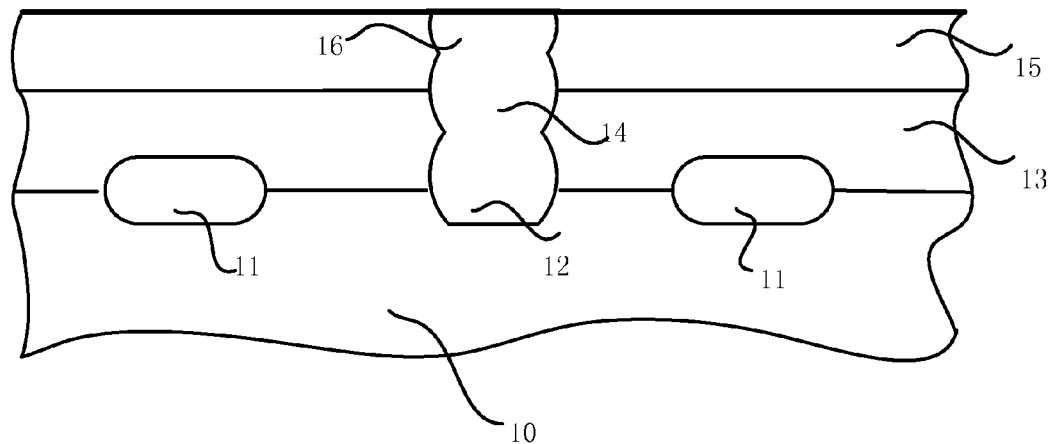

Refer to FIG. 6, ions are implanted into the second epitaxial layer 15 to form a second isolation region 16 of P-type doping therein, which serves as a third layer of the isolation region. In particular, it may include: growing a thin oxide layer with a thickness selective between 300 Å~600 Å; then locating a region for the second isolation region 16 with a lithography mask and performing ion implantation, wherein the implanted ions may be for example boron ions, the implanting energy may be 60~100 KeV, and the implantation dosage is selective between $1E12{\sim}1E14/cm^2$; then annealing at an annealing temperature selective between 1000~1100° C. for a time duration selective between 0.5~2 H, and then annealing for 2~8 H respectively in a nitrogen atmosphere and an oxygen atmosphere at a temperature of 1200° C., such that the second isolation region 16, the first isolation region 14 diffuse to joint in sequence, thereby forming an isolation region which contacts with the first buried layer 12. After pushing the junction by annealing, the isolation region (including the first isolation region 14 and the second isolation region 16) has a doping concentration on the same order as the first epitaxial layer 13 and the second epitaxial layer 15.

Figure 7:
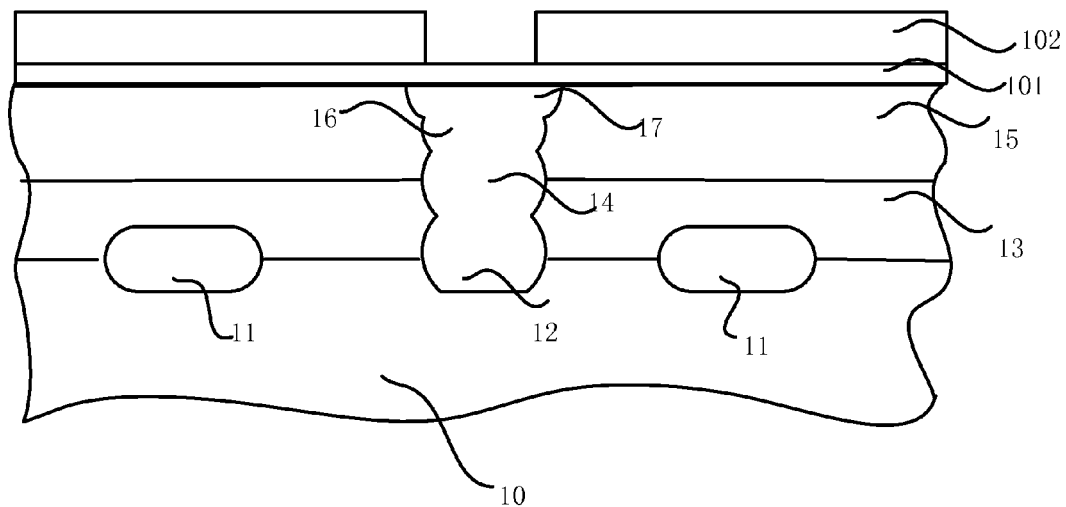

Refer to FIG. 7, a pad oxide layer (e.g., with a material of $SiO_2$) 101 may be grown on the second epitaxial layer 15, and a local oxidation dielectric layer (e.g., with a material of SiN) 102 may be formed over the pad oxide layer 101, wherein the pad oxide layer 101 has a thickness selective between 250~400 Å, and the local oxidation dielectric layer 102 has a thickness selective between 1000~1500 Å; then an oxidation region is located with an active region lithography mask, and a local oxidation region is etched with a method such as dry etching.

Then, lithography may be performed with an isolation mask, and a photoresist and the local oxidation dielectric layer 102 are used as a masking layer to perform ion implantation onto the surface of the second epitaxial layer 15, in order to form an isolation surface region 17 of P-type doping, wherein the implanted ions may be boron ions, the implanting energy may be 25~50 KeV, and the implantation dosage is $5E13{\sim}5E14/cm^2$. The isolation surface region 17 may be used as a fourth layer of the isolation region.

Figure 8:
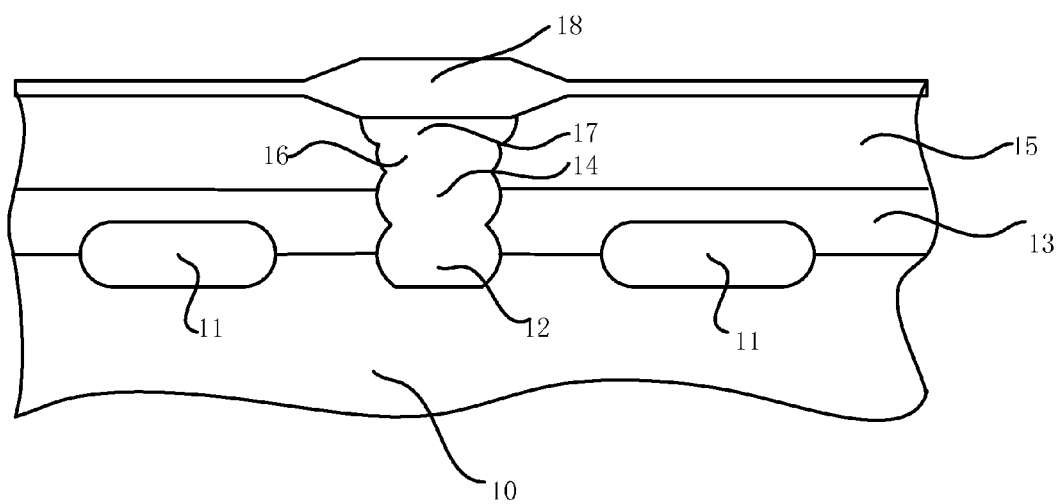

Then refer to FIG. 8, a field oxide layer 18 is formed over the isolation surface region 17, e.g., by Local Oxidation of Silicon (LOCOS), the field oxide layer 18 having a thickness of 6000~18000 Å. Meanwhile, annealing is performed for the implantation of the isolation surface region 17.

It should be noted that, in this embodiment, the first isolation region 14 and the second isolation region 16 are of P-type doping. To prevent the surface doping concentration of the isolation structure from decreasing due to the boron adsorption effect in forming the field oxide layer 18, the isolation surface region 17 may be formed under the field oxide layer 18, so as to increase the doping concentration of the isolation structure. If the first isolation region 14 and the second isolation region 16 are of N-type doping, the isolation surface region 17 is unnecessary, thus the field oxide layer 18 may be formed directly on the second isolation region 16.

Then, devices, such as LDMOS transistors, etc., may be manufactured as in a normal BCD process.

So far, the isolation structure formed in this embodiment is as illustrated in FIG. 8, comprising: a substrate of P-type doping; an epitaxial layer of N-type doping (including stacked first epitaxial layer 13 and second epitaxial layer 15 in this embodiment) over the semiconductor layer 10; an isolation region of P-type doping (including the isolation surface region 17, the second isolation region 16, the first isolation region 14, and the first buried layer 12 in this embodiment), wherein the isolation region extends through the epitaxial layer into the semiconductor substrate 10, wherein the isolation region has a doping concentration on the same order as the doping concentration of the epitaxial layer; and a field oxide layer 18 over the isolation region, in particular over the isolation surface region 17 in this embodiment.

When a high-voltage device breaks down, the charges in the isolation region and the epitaxial island where the high-voltage device is located will be completely depleted, wherein the epitaxial island refers to the epitaxial layer between adjacent isolation regions. It should be noted that, the charges being completely depleted includes a situation where the charges are nearly depleted within an acceptable error range.

In this embodiment, the first epitaxial layer 13 and the second epitaxial layer 15 collectively form a stacked epitaxial layer, and the first buried layer 12 is formed in the semiconductor substrate. After each epitaxial layer is formed, ion implantation is performed therein to form a corresponding isolation region. Then, the junction is pushed and diffused by annealing, such that the isolation region in each epitaxial layer as well as the first buried layer 12 joint with each other to form a complete isolation region. However, those skilled in the art should understand, the number of stacked layers in the epitaxial layer is not limited to 2 layers, but may be for example 1 layer, 3 layers, etc.

The technical scheme of this embodiment may implement LDMOS transistors on an order of 1200V and high-voltage devices on an order of 1200V to an integrated isolation structure, and is applicable to high-voltage BCD process above 1200V. The isolation region is formed by performing epitaxy and ion implantation each twice, thereby reducing the lateral diffusion size, and saving the footprint area. Meanwhile, the formation of the isolation surface region may prevent the electric leakage phenomena caused by decrease of the surface impurity concentration of the isolation region due to the boron adsorption effect in forming the field oxide layer.

In addition, the doping concentration in the isolation region and the doping concentration in the epitaxial island may be adjusted to a near-balanced state by the process. When a high-voltage device breaks down, the charges in the isolation region and the epitaxial island where the high-voltage device is located will almost be completely depleted, such that the breakdown point of the high-voltage device on the epitaxial island occurs on the vertical epitaxial junction surface, thereby increasing the breakdown voltage of the 1200V high-voltage LDMOS transistor.

Further, since the doping concentration of the whole isolation region is lower than a conventional isolation structure, the carrier concentration is lower. When a device breaks down at a high-voltage, the charges in the isolation region will almost be completely depleted. It is known from the CV theory for a MOS capacitor that, with a lower carrier concentration, the oxide layer of the MOS capacitor may be made thinner at the same threshold voltage. That is, for a 1200V high-voltage BCD isolation structure, the thickness of the field oxide layer under the aluminum wiring of the high-voltage device may be smaller, and the isolation region can still withstand a parasitical breakdown voltage of 1200V, thereby improving the planarization of oxide layer steps on the silicon surface in the whole high-voltage BCD process, and enhancing the reliability of the product.

Although the invention has been disclosed above with preferred embodiments, which are not intended to limit the invention. Possible variations and modifications can be made by those skilled in the art without departing from the spirit and scope of the invention. Accordingly, the scope of the invention is defined by the Claims of the invention.

The invention claimed is:

1. An isolation structure for a high-voltage device in a high-voltage BCD process, comprising:
   a semiconductor substrate having a first type of doping;
   an epitaxial layer having a second type of doping over the semiconductor substrate, wherein the epitaxial layer is a stacked structure and the first type of doping is opposite to the second type of doping;
   an isolation region having the first type of doping, wherein the isolation region extends through the epitaxial layer into the semiconductor substrate, wherein the isolation region has a doping concentration on the same order as a doping concentration of the epitaxial layer and wherein a breakdown voltage of the high-voltage device in the high-voltage BCD process is increased; and
   a field oxide layer over the isolation region.

2. The isolation structure for the high-voltage device in the high-voltage BCD process of claim 1, wherein when the high-voltage device breaks down, charges in the isolation region and an epitaxial island where the high-voltage device is located are completely depleted, wherein the epitaxial island refers to an epitaxial layer between adjacent isolation regions.

3. The isolation structure for the high-voltage device in the high-voltage BCD process of claim 1, wherein the field oxide layer has a thickness of 6000~18000 Å.

4. The isolation structure for the high-voltage device in the high-voltage BCD process of claim 1, wherein the first type of doping is P-type, and the second type of doping is N-type.

5. The isolation structure for the high-voltage device in the high-voltage BCD process of claim 4, further comprising:
   an isolation surface region of the first type of doping located on a surface of the epitaxial layer beneath the field oxide layer.

6. An isolation structure for a high-voltage device in a high-voltage BCD process, comprising:
   a semiconductor substrate having a first type of doping;
   an epitaxial layer having a second type of doping over the semiconductor substrate, wherein the epitaxial layer is a stacked structure and the first type of doping is opposite to the second type of doping;
   an isolation region having the first type of doping, wherein the isolation region extends through the epitaxial layer into the semiconductor substrate, and wherein the isolation region has a doping concentration on the same order as a doping concentration of the epitaxial layer, wherein a breakdown voltage of the high-voltage device in the high-voltage BCD process is increased, said epitaxial layer being a stacked structure with 2 layers, including stacked first epitaxial layer and second epitaxial layer, wherein the first epitaxial layer has a thickness of 3.0~15.0 μm and a resistivity of 1.0~10 Ω·cm, the second epitaxial layer has a thickness of 3.0~15.0 μm and a resistivity of 1.0~4.0 Ω·cm; and
   a field oxide layer over the isolation region.

7. The isolation structure for the high-voltage device in the high-voltage BCD process of claim 6, wherein when the high-voltage device breaks down, charges in the isolation region and an epitaxial island where the high-voltage device is located are completely depleted, wherein the epitaxial island refers to an epitaxial layer between adjacent isolation regions.

8. The isolation structure for the high-voltage device in the high-voltage BCD process of claim 6, wherein the field oxide layer has a thickness of 6000~18000 Å.

9. The isolation structure for the high-voltage device in the high-voltage BCD process of claim 6, wherein the first type of doping is P-type, and the second type of doping is N-type.

10. The isolation structure for the high-voltage device in the high-voltage BCD process of claim 9, further comprising:
   an isolation surface region of the first type of doping located on a surface of the epitaxial layer beneath the field oxide layer.

* * * * *